United States Patent [19]

Kloczewski

[11] 3,847,767

[45] Nov. 12, 1974

[54] METHOD OF PRODUCING A SCREEN PRINTABLE PHOTOCURABLE SOLDER RESIST

[75] Inventor: Harold A. Kloczewski, Pasadena, Md.

[73] Assignee: W. R. Grace & Co., New York, N.Y.

[22] Filed: Mar. 13, 1973

[21] Appl. No.: 340,870

[52] U.S. Cl. ........... 204/159.14, 96/35.1, 96/115 P, 96/115 R, 204/159.13, 204/159.15, 204/159.18, 204/159.23

[51] Int. Cl. ........................... B01j 1/10, G03c 1/70

[58] Field of Search..... 204/159.23, 159.15, 159.14; 96/115 R, 115 P, 35.1

[56] References Cited

UNITED STATES PATENTS

| | | | |
|---|---|---|---|
| 3,753,720 | 8/1973 | Kloczewski et al. | 96/115 R |
| 3,770,433 | 11/1973 | Bartelt et al. | 96/36 |

*Primary Examiner*—Murray Tillman
*Assistant Examiner*—Thurman Kennis Page
*Attorney, Agent, or Firm*—Richard P. Plunkett; Kenneth E. Prince

[57] ABSTRACT

This invention relates to a method of preparing a screen printable, photocurable, solder resist coating from low molecular weight photocurable compositions comprising a polyene, a polythiol, a photocuring rate accelerator and silicone oil which comprises subjecting to actinic radiation said polyene, photocuring rate accelerator and silicone oil with up to only 20 percent of the polythiol required to react stoichiometrically with said polyene thereby increasing the viscosity of the composition and thereafter adding sufficient polythiol to the irradiated composition to react with between 50 to 100 percent of the remaining polyene to form a screen printable, photocurable, solder resist coating.

1 Claim, No Drawings

METHOD OF PRODUCING A SCREEN PRINTABLE PHOTOCURABLE SOLDER RESIST

This invention relates to a method of preparing a screen printable, photocurable, solder resist coating from low molecular weight photocurable compositions. More particularly this invention relates to a method whereby low viscosity photocurable compositions can be used as screen printable solder resist coatings.

The soldering of electrical components to a printed circuit board is a multi-step, time-consuming task. More precisely, before the electrical components can be soldered to the board, the following steps must be carried out. An insulating board such as epoxy fiberglas board must be copper-clad. The copper-clad board is then drilled at predetermined sites where the land holes will be. The boards are then deburred and cleaned and the cladding is washed in ammonium persulfate solution and then in water (5–10% $H_2SO_4$ solution) or other solvent to remove excess ammonium persulfate. A catalyst is then applied to the board for electroless deposition of copper to coat not only the inside of the drilled holes, but also the entire board. Following electroless deposition of copper, additional copper is put on the board and in the holes by electroplating. The thus electroplated copper is then covered with a conventional photoresist and exposed imagewise through a printed circuit transparency to UV light, thus curing (hardening) the exposed portion of the photoresist. The unexposed portion of the photoresist is washed off, exposing the copper thereunder, i.e., where the lands, wiring conductors and connecting pads are formed. Positive working resists can also be used, if desired at this stage. The thus exposed copper circuit is then electroplated in a tin-lead plating bath, thereby coating solder onto the exposed copper on the board and in the holes. The cured photoresist is then stripped in a solvent and/or by mechanical means and the copper under the cured photoresist is etched away in a conventional copper etching bath. It is at this point that one can then commence the sequence of steps necessary to solder electrical components to the circuit board.

In the solder resist field today one or two component resin systems, usually epoxies or melamine/alkyds are currently used as screen printable solder resist coatings. These materials contain solvents and are adjusted in viscosity to accomodate screen printing. Such screen printable solder resist coatings must be cured at elevated temperatures after screen printing prior to soldering to remove the solvent and cure the resin. Such a step requires capital investment for standing ovens or conveyorized hot air driers able to maintain temperatures from 150°–300°F.

Photocurable compositions are starting to enter the solder resist field. However such photocurable compositions have the drawback that they do not have a sufficiently high viscosity, i.e., in the range 5,000–200,000 centipoises, to be operable as a screen printable solder resist coating. One method employed to overcome this problem is the addition of fillers to impart increased viscosity to the formulations. However these filler materials can, if present in high enough concentration, have a detrimental effect on the adhesion of the solder resist to the printed circuit board.

One object of the instant invention is to produce a photocurable solder resistant composition which is screen printable. As used herein the term "screen printable" means that the screen is imaged and thus the coating is applied only where one desires it and not uniformly all over the board. Another object of the invention is to produce a screen printable, photocurable, solder resistant composition which, in its cured state, is capable of withstanding molten solder bath temperatures in the range of 400°–600°F. Other objects will become obvious from a reading hereinafter.

The above and other objects are obtained by the method of preparing a screen printable, photocurable, solder resist from a low molecular weight photocurable composition which comprises admixing 1. a polyene selected from the group consisting of:

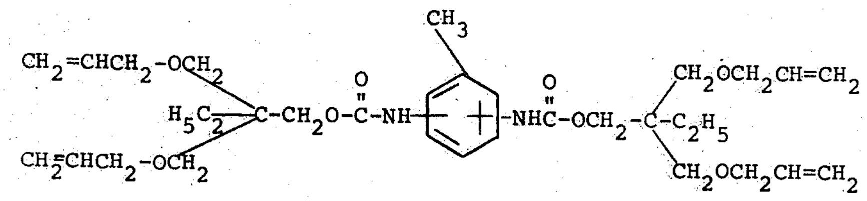

,and

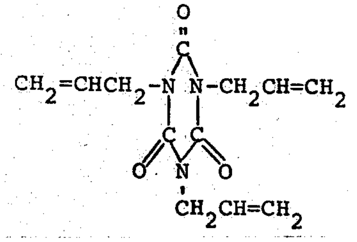

;

2. Up to 20 percent of a polythiol sufficient to react stoichiometrically with said polyene 3. 3 to 20 parts by weight based on the weight of (1) and (2) of silicone oil and 4. 0.05 to 10 parts by weight based on the weight of (1) and (2) of a photocuring rate accelerator, subjecting said admixture to actinic radiation for a period sufficient to react substantially all of the polythiol present with a portion of the polyene whereby the viscosity of the irradiated admixture is increased and thereafter in the absence of actinic radiation adding additional polythiol to the irradiated admixture in an amount sufficient to cause at least 50 percent of the polyene based on the total initial unreacted content to react with said added polythiol thereby forming a screen printable, photocurable solder resist having a viscosity in the range of 5,000–200,000 centipoises.

The critical ingredients in the screen printable, solder resistant photocurable composition are:

1. a polythiol containing at least two thiol groups per molecule;
2. a polyene selected from the group consisting of:

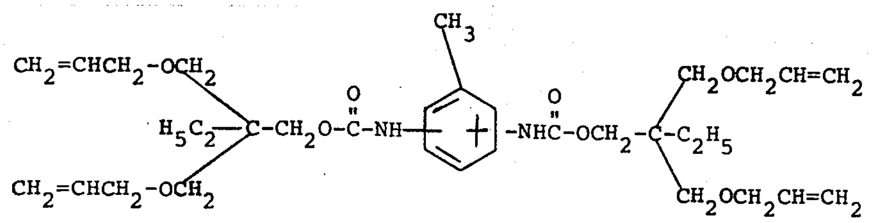
, and

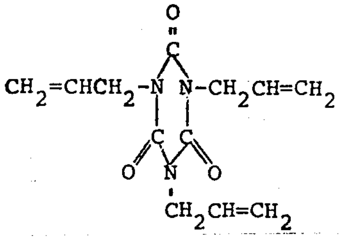
;

3. 3 to 20 parts by weight based on the weight of (1) and (2) of silicone oil and 4. 0.05 to 10 parts by weight based on the weight of (1) and (2) of a photocuring rate accelerator.

It is to be understood, however, that when energy sources other than visible or ultraviolet light are used to initiate the curing reaction, photocuring rate accelerators (i.e., photosensitizers, etc.) generally are not required in the formulation.

It is to be understood that aside from the presence of a photocuring rate accelerator which depends upon the energy source, it is critical that the other components of the composition be present to obtain an operable screen printable, photocurable, solder resist. That is, without the polyene and the polythiol being present, no photocurable solder resist results. Additionally, without the presence of the silicone oil, "solder balling," i.e., the clinging of minute beads of solder to the resist occurs. These minute beads of solder fall off after the board has been inserted into the mechanism, thus causing short circuits. Furthermore, without the silicone oil, most compositions, due to inclusions of air bubbles, cannot be applied by the silk screen method. A further function of the silicone oil is to insure a homogeneous product from the precuring step. That is, if the silicone oil is not added until after the material is precured to increase its viscosity, the precured material is lumpy and cannot be used in screen printing.

Various photosensitizers, i.e., photocuring rate accelerators are operable and well known to those skilled in the art. Examples of photosensitizers include, but are not limited to benzophenone, acetophenone, acenapthene-quinone, methyl ethyl ketone, valerophenone, hexanophenone, γ-phenylbutyrophenone, p-morpholinopropiophenone, dibenzosuberone, 4-morpholinobenzophenone, 4'-morpholinodeoxybenzoin, p-diacetylbenzene, 4-aminobenzophenone, 4'-methoxyacetophenone, benzaldehyde, α-tetralone, 9-acetylphenanthrene, 2-acetylphenanthrene, 10-thioxanthenone, 3-acetylphenanthrene, 3-acetylindole, 9-fluorenone, 1-indanone, 1, 3, 5-triacetylbenzene, thioxanthen-9-one, xanthene-9-one, 7-H-benz[de]anthracen-7-one, 1-naphthaldehyde, 4,4'-bis(dimethylamino)benzophenone, fluorene-9-one, 1'acetonaphthone, 2'-acetonaphthone and 2,3-butanedione, etc., which serve to give greatly reduced exposure times and thereby when used in conjunction with various forms of energetic radiation yield very rapid, commercially practical time cycles by the practice of the instant invention.

The polyenes operable in the instant invention are those set out supra. It has been found that not all polyenes are operable herein for various reasons. For example, some polyenes that have too high a viscosity cannot be applied uniformly as a coating by the screening method. Other polyenes of too low a viscosity tend to run through the holes in the printed circuit board, thereby resulting in an unevenly cured coating on the board surface. Still other polyenes, after curing, do not have sufficient heat resistance to withstand the molten solder bath.

As used herein, the term polythiols refers to simple or complex organic compounds having a multiplicity of pendant or terminally positioned —SH functional groups per average molecule.

On the average the polythiols must contain two or more —SH groups/molecule. They usually have a viscosity range of 0 to 20 million centipoises (cps) at 70°C as measured by a Brookfield Viscometer. Included in the term "polythiols" as used herein are those materials which in the presence of an inert solvent, aqueous dispersion or plasticizer fall within the viscosity range set out above at 70°C. Operable polythiols in the instant invention usually have molecular weights in the range 50–20,000, preferably 100–10,000.

The polythiols operable in the instant invention can be exemplified by the general formula: $R_8\text{—}(SH)_n$ where n is least 2 and $R_8$ is a polyvalent organic moiety free from reactive carbon to carbon unsaturation. Thus $R_8$ may contain cyclic groupings and minor amounts of hetero atoms such as N, S, P or O but primarily contains carbon-hydrogen, carbonoxygen, or silicon-oxygen containing chain linkages free of any reactive carbon to carbon unsaturation.

One class of polythiols operable with polyenes in the instant invention to obtain a polythioether photoresist are esters of thiol-containing acids of the general formula: HS—$R_9$—COOH where $R_9$ is an organic moiety containing no "reactive" carbon to carbon unsaturation with polyhydroxy compounds of the general structure: $R_{10}\text{—}(OH)_n$ where $R_{10}$ is an organic moiety containing no "reactive" carbon to carbon unsaturation and *n* is 2 or greater. These components will react under suitable conditions to give a polythiol having the general structure:

$$R_{10}\text{—}(O\overset{O}{\overset{\|}{C}}\text{-}R_9\text{-}SH)_n$$ where $R_9$ where $R_9$ and $R_{10}$ are organic moieties containing no "reactive" carbon to carbon unsaturation and *n* is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as thiol-terminated ethylcyclohexyl dimercaptan polymer, etc. and similar polythiols which are conveniently and ordinarily synthesized on a commercial basis, although having obnoxious odors, are operable in this invention but many of the end products are not widely accepted from a practical, commercial point of view. Examples of the polythiol compounds preferred for this invention because of their relatively low odor level include, but are not limited to, esters of thioglycolic acid ($HS—CH_2COOH$), $\alpha$-mercaptopropionic acid ($HS—CH(CH_3)—COOH$) and $\beta$-mercaptopropionic acid ($HS—CH_2COOH$) with polyhydroxy compounds such as glycols, triols, tetraols, pentaols, hexaols, etc. Specific examples of the preferred polythiols include, but are not limited to, ethylene glycol bis (thioglycolate), ethylene glycol bis ($\beta$-mercaptopropionate), trimethylolpropane tris (thioglycolate), trimethylolpropane tris ($\beta$-mercaptopropionate), pentaerythritol tetrakis (thioglycolate), tris (hydroxyethyl) isocyanurate tris ($\beta$-mercaptopropionate) and pentaerythritol tetrakis ($\beta$-mercaptopropionate), most of which are commercially available. A specific example of a preferred polymeric polythiol is polypropylene ether glycol bis ($\beta$-mercaptopropionate) which is prepared from polypropylene ether glycol (e.g., Pluracol P2010, Wyandotte Chemical Corp.) and $\beta$-mercaptopropionic acid by esterification.

The preferred polythiol compounds are characterized by a low level of mercaptan-like odor initially, and after reaction, give essentially odorless polythioether end products which are commercially attractive.

In practicing the instant invention it is necessary that only up to 20 percent, preferably 5–15 percent of the polythiol required to react stoichiometrically with the polyene is added for the precuring step to increase the viscosity of the composition. Amounts in excess of 20 percent produce a gel content of too high a magnitude to allow application by screen printing. When amounts of the polythiol up to 20 percent of that required to react stoichiometrically with the polyene are added, the viscosity of the precured composition may exceed 200,000 centipoises which is the approximate operable upper limit for screen printable compositions. However when the additional liquid polythiol is added to the composition prior to use, the viscosity is reduced to the operable range of 5,000–200,000, preferably 8,000–20,000 centipoises.

The term "functionality" as used herein refers to the average number of ene or thiol groups per molecule in the polyene or polythiol, respectively. For example, a tetraene is a polyene with an average of four "reactive" carbon to carbon unsaturated groups per molecule and thus has a functionality (f) of four. A dithiol is a polythiol with an average of two thiol groups per molecule and thus has a functionality (f) of two.

The function of the silicone oil is three-fold. Firstly, it prevents the formation of lumps in the product of the precuring step. Secondly, it facilitates the application of the composition as a coating on the printed circuit by means of silk screening. If silicone oil is not used, the silk screened coating is full of air bubbles or inclusions which cause pin holes in the resultant cured solder resist, rendering it inoperable. Thirdly, the silicone oil prevents "solder balling," Solder balling is the clinging of minute beads of solder to the resist. They can then fall off after insertion of the board into the device possibly causing a short circuit. This latter problem is very prevalent in the industry and causes high labor costs associated with removal of solder balls by hand. Furthermore, the amount of silicone oil employed is critical and should be between 3–20 percent by weight of the polyene and polythiol in the composition. If less than the lower limit of silicone oil is used, solder balling will result. If greater than the upper limit is employed, a separation of phases occurs prior to curing, rendering the composition inoperable to prevent solder balling.

To obtain the maximum strength, solvent resistance, creep resistance, heat resistance and freedom from tackiness, the reactive components consisting of the polyenes and polythiols in combination with the silicone oil and curing rate accelerator of this invention are formulated in such a manner as to give solid, crosslinked, three dimensional network polythioether polymer systems on curing. In order to achieve such infinite network formation, the individual polyenes and polythiols must each have a functionality of at least 2 and the sum of the functionalities of the polyene and polythiol components must always be greater than 4. Blends and mixtures of the polyenes and the polythiols containing said functionality are also operable herein.

The screen printable, solder resistant photopolymer compositions to be cured, i.e., (converted to solid resins or elastomers) in accord with the present invention may, if desired, include such additives as stabilizers, anti-oxidants, accelerators, dyes, inhibitors, activators, fillers, pigments, anti-static agents, flame-retardant agents, surface-active agents, extending oils, plasticizers, and the like within the scope of this invention. Such additives are usually preblended with the polyene or polythiol prior to or during the compounding step. The aforesaid additives may be present in quantities up to 500 or more parts based on 100 parts by weight of the polyenepolythiol solder resist compositions and preferably 0.005–300 parts on the same basis.

To insure that the reaction does not pre-cure prior to use, stabilizers are usually added to either the polyene or polythiol prior to admixture of these two components. Operable stabilizers include various well known commercially available materials such as octadecyl $\beta$(4-hydroxy-3,5-di-t-butylphenyl) propionate commercially available from Geigy Chemical Co., under the tradename "Irganox 1076;" 2,6-ditertiary-butyl-4-methylphenol commercially available under the tradename "Ionol" from Shell Chemical Co., pyrogallol, phosphorous acid and the like. The stabilizers are usually added in amounts ranging from 0.1 to 5.0 parts per 100 parts by weight of the polyene/polythiol composition. In some instances, heat up to about 60°C is employed to dissolve the stabilizers in either the polyene or the polythiol.

The preferred means of curing is by means of electromagnetic radiation of wavelength of about 2,000–4,000 A because of simplicity, economy and convenience. The polyene-polythiol solder resistant composition of the instant invention can be cured also by imagewise directed beams of ionizing irradiation.

When UV radiation is used for the curing reaction, a dose of 0.0004 to 6.0 watts/cm$^2$ is usually employed.

The following examples will explain but expressly not limit the instant invention. Unless otherwise noted all parts and percentages are by weight.

EXAMPLE I 40 grams of commercially available trially isocyanurate were admixed with 8.0 grams of pentaerythritol tetrakis (β-mercaptopropionate) commercially available from Carlisle Chemical Co. under the tradename "Q–43," 4.8 grams of silicone oil commercially available under the tradename "L–45" from Union Carbide Co. and 0.2 grams of benzophenone. The mixture was stirred until homogeneously admixed and then exposed directly to a 275 watt RS sunlamp at a surface intensity on the admixture of 4,000 microwatts/cm$^2$ until the reaction was complete. This precured material, when measured on a Brookfield viscometer at 30 RPM using a number 4 spindle, had a viscosity of 26,200 centipoises.

To the precured material was added 26.8 grams of pentaerythritol tetrakis (β-mercaptopropionate), 0.8 grams of benzophenone as a photocuring rate accelerator and as stabilizers 0.31 grams phosphorous acid, 0.2 grams of octadecyl β-(4-hydroxy-3, 5-di-t-butylphenyl) propionate and 0.2 grams of 2,6-ditertiary-butyl-4-methylphenol. After stirring until homogeneous the admixed composition had a viscosity of 10,300 centipoises. The admixture was then squeegeed through a 200 mesh screen imaged in the land or pad areas on a Colt 18 screen printer manufactured by American Screen Printing Company having a 20 inches × 26 inches frame and drawn down to a 2 mil thick layer deposit of the admixture on a drilled, flexible insulating board of polyester epoxy fiberglass composition. The board had a copper circuit thereon on both sides thereof, said circuit being covered with a tin-lead solder on both sides of the board. The board with the photocurable composition thereon except in the land or pad areas was exposed to a 275 watt sunlamp at a surface intensity on the photocurable composition of 4,000 microwatts/cm$^2$ for 7 minutes to solidify and cure the photocurable composition. The major spectral lines of the lamp were all above 3,000 angstroms. The coating and exposure steps were repeated on the other side of the board. The leads of electrical components were inserted through the holes in the board and the board was passed over foaming flux, i.e., "Hydrosolv 709," a fast drying organic flux commercially available from Alphametals, Inc., Jersey City, N.J., to coat the land areas to be soldered with the flux. The board was then conveyed over a preheater maintained at a temperature of 700°F and then over a tin lead solder bath maintained at 500°F. The solder was splashed on the underside of the board thereby soldering the leads of the components extending therethrough to the board. The printed circuit board with the electrical components was then washed in water to remove the flux and then dried. Inspection of the board showed that the cured composition remained on the board and was unaffected by the soldering steps and that no solder balling occured.

The above portion of Example I was repeated except that the total photocurable composition, i.e., 40 grams of triallyl isocyanurate, 34.8 grams of pentaerythritol tetrakis (β-mercaptopropionate), 1.0 grams of benzophenone, 4.8 grams of silicone oil and 0.31 grams phosphorous acid, 0.2 grams of octadecyl β-(4-hydroxy-3, 5-di-t-butylphenyl) propionate and 0.2 grams of 2,6-ditertiary-butyl-4-methylphenol were homogeneously admixed without precuring. The viscosity of the admixture was 1,000 centipoises. This admixture was applied through a screen and exposed as set out above in Example I. On inspection it could be seen that the photocurable composition because of its low viscosity had run into the land areas of the board. On subsequent soldering, some of the components failed to solder to the board due to cured photoresist in the land areas.

EXAMPLE II

A round bottom flask is fitted with a stirrer, thermometer, dropping funnel, nitrogen inlet and outlet. The flask can be placed in a heating mantle or immersed in a water bath as required.

Two moles (428 gms.) of trimethylol-propane diallyl ether were mixed with 0.2 cc. of dibutyl tin dilaurate under nitrogen. One mole of tolylene -2,4-diisocyanate was added to the mixture, using the rate of addition and cooling water to keep the temperature under 70°C. The mantle was used to keep the temperature at 70°C. for another hour. Isocyanate analysis showed the reaction to be essentially complete at this time resulting in the following product:

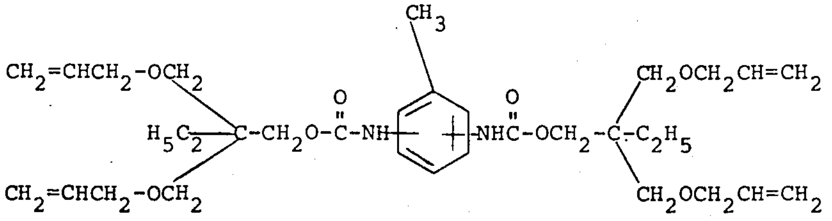

which will be referred to hereinafter as Prepolymer A.

EXAMPLE III 100 grams of Prepolymer A from Example II were admixed with 10 grams of pentaerythritol tetrakis β-mercaptopropionate, 18.0 grams of silicone oil commercially available under the tradename "L–45" from Union Carbide Co. and 1.11 grams of benzophenone. The mixture was stirred until homogeneously admixed and then exposed directly to a 275 watt sunlamp at a surface intensity on the admixture of 4,000 microwatts/cm$^2$ until the reaction was complete. This precured material, when measured on a Brookfiled viscometer at 30 RPM using a number 4 spindle, had a viscosity of 30,300 centipoises.

To the precured material was added 80 grams of pentaerythritol tetrakis (β-mercaptopropionate), 1.11 grams of benzophenone as a photocuring rate accelerator, and as stabilizers 0.52 grams of octadecyl β-(4-hydroxy-3,5-di-t-butylphenyl) propionate, 0.52 grams of 2,6-ditertiarybutyl-4-methylphenol and 0.9 grams of phosphorous acid. After stirring until homogeneous, the admixed photocurable composition had a viscosity of 11,000 centipoises.

The admixture was then squeegeed through a 200 mesh screen imaged in the land or pad areas on a Colt 18 screen printer manufactured by American Screen Printing Company having a 20 inches × 26 inches frame and drawn down to a 2 mil thick layer deposit of the admixture on a drilled flexible insulating board of polyester epoxy fiberglass composition. The board had a copper circuit thereon on both sides thereof, said circuit being covered with a tin lead solder on both sides of the board. The board with the photocurable composition thereon except in the land or pad areas was exposed to a 275 watt sunlamp at a surface intensity on the photocurable composition of 4,000 microwatts/cm² for 7 minutes to solidify and cure the photocurable composition. The major spectral lines of the lamp were all above 3,000 angstrams. The coating and exposure steps were repeated on the other side of the board. The leads of electrical components were inserted through the holes in the board and the board was passed over foaming flux, i.e., "Hydrosolv 709," a fast drying organic flux commercially available from Alphametals, Inc., Jersey City, N.J., to coat the land areas to be soldered with the flux. The board was then conveyed over a preheater maintained at a temperature of 700°F and then over a tin lead solder bath maintained at 500°F. The solder was splashed on the underside of the board thereby soldering the leads of the components extending therethrough to the board. The printed circuit board with the electrical components was then washed to remove the flux and then dried. Inspection of the board showed that the cured composition remained on the board and was unaffected by the soldering steps and that no solder balling occured.

The above Example III was repeated except that the entire composition to be squeegeed was admixed homogeneously without any portion thereof being subject to precuring. The admixture had a viscosity of 2,200 cps. This admixture was applied through a screen and exposed as set out above in Example I. On inspection it could be seen that the photocurable composition because of its low viscosity had run into the land areas of the board. On subsequent soldering, some of the components failed to solder to the board due to cured photoresist in the land areas.

EXAMPLE IV

Examples I and III were repeated with the precuring step except that in all instances the silicone oil was omitted from the formulation. In both cases the precured material was lumpy and after application and exposure, pinholes were noted in the photoresist. Such pinholes preclude the use of the material as a photoresist since they allow the solder to enter said pinholes and cause bridging between circuits.

EXAMPLE V

Example I was repeated except that 29.4 grams (50 percent stoichiometrically) of pentaerythritol tetrakis (β-mercaptopropionate) was added to the admixture to be precured instead of 8.0 grams. The admixture after precuring was a solid and thus not screen printable.

What is claimed is:

1. A process for preparing a screenable liquid photocurable solder resist ink from a low molecular weight photocurable composition which comprises admixing 1. a polyene selected from the group consisting of

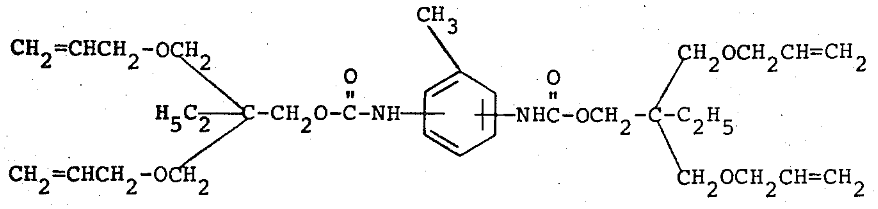

, and

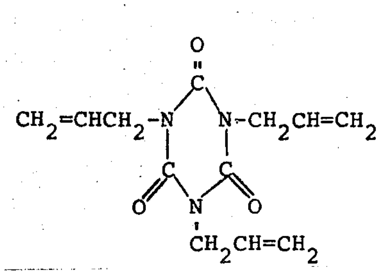

2. Up to 20 percent of a polythiol sufficient to react stoichiometrically with said polyene
3. 3 to 20 parts by weight based on the weight of (1) and (2) of silicone oil and
4. 0.05 to 10 parts by weight based on the weight of (1) and (2) of a photocuring rate accelerator, subjecting said admixture to actinic radiation at a dose of 0.0004 to 6.0 watts/cm.² for a period sufficient to react substantially all of the polythiol present with a portion of the polyene whereby the viscosity of the irradiated admixture is increased and thereafter in the absence of actinic radiation adding additional polythiol to the irradiated admixture in an amount sufficient to cause at least 50 percent of the polyene based on the total initial unreacted content to react with said added polythiol thereby forming a screenable photocurable solder resist ink having a viscosity in the range of 5,000–200,000 centipoises.

* * * * *